(12) United States Patent
Lu

(10) Patent No.: US 11,869,972 B2
(45) Date of Patent: Jan. 9, 2024

(54) REDUCED-FORM-FACTOR TRANSISTOR WITH SELF-ALIGNED TERMINALS AND ADJUSTABLE ON/OFF-CURRENTS AND MANUFACTURE METHOD THEREOF

(71) Applicant: Etron Technology, Inc., Hsinchu (TW)

(72) Inventor: Chao-Chun Lu, Taipei (TW)

(73) Assignees: Etron Technology, Inc., Hsinchu (TW); Invention And Collaboration Laboratory Pte. Ltd., Singapore (SG)

( * ) Notice: Subject to any disclaimer, the term of this patent is extended or adjusted under 35 U.S.C. 154(b) by 0 days.

(21) Appl. No.: 16/388,836

(22) Filed: Apr. 18, 2019

(65) Prior Publication Data

US 2020/0168736 A1 May 28, 2020

Related U.S. Application Data

(60) Provisional application No. 62/824,315, filed on Mar. 27, 2019, provisional application No. 62/783,203, (Continued)

(51) Int. Cl.
*H01L 29/78* (2006.01)
*H01L 29/10* (2006.01)
(Continued)

(52) U.S. Cl.
CPC ...... *H01L 29/7851* (2013.01); *H01L 21/0262* (2013.01); *H01L 21/02532* (2013.01);
(Continued)

(58) Field of Classification Search
CPC ............ H01L 29/0653; H01L 29/0847; H01L 29/1033; H01L 29/401; H01L 29/41783;
(Continued)

(56) References Cited

U.S. PATENT DOCUMENTS 4,873,205 A 10/1989 Critchlow
4,877,750 A 10/1989 Okumura
(Continued)

FOREIGN PATENT DOCUMENTS

CN 101908543 A 12/2010
CN 111223934 A 6/2020
(Continued)

*Primary Examiner* — Vongsavanh Sengdara
(74) *Attorney, Agent, or Firm* — Winston Hsu

(57) ABSTRACT

A transistor structure includes a gate structure, a channel region, a drain region and a source region. The gate structure is positioned above a silicon surface of a first silicon material, the channel region is under the silicon surface, and the channel region includes a first terminal and a second terminal. The drain/source region is independent and not derived from the first silicon material, the drain region includes a first predetermined physical boundary directly connected to the first terminal of the channel region, and the source region includes a second predetermined physical boundary directly connected to the second terminal of the channel region. The drain/source region includes a lower portion below the silicon surface and the bottom of the lower portion of the drain/source region is confined to an isolator, and sidewalls of the drain/source region are confined to spacers except sidewalls of the lower portion of the drain/source region.

14 Claims, 15 Drawing Sheets

Related U.S. Application Data filed on Dec. 21, 2018, provisional application No. 62/771,177, filed on Nov. 26, 2018.

(51) Int. Cl.

| | | |
|---|---|---|
| *H01L 29/08* | (2006.01) | |
| *H01L 29/06* | (2006.01) | |
| *H01L 29/66* | (2006.01) | |
| *H01L 21/762* | (2006.01) | |
| *H01L 21/02* | (2006.01) | |
| *H01L 29/417* | (2006.01) | |
| *H01L 29/40* | (2006.01) | |
| *H01L 21/3213* | (2006.01) | |
| *H01L 21/265* | (2006.01) | |
| *H01L 29/49* | (2006.01) | |
| *H01L 21/311* | (2006.01) | |

(52) U.S. Cl.
CPC .. *H01L 21/02598* (2013.01); *H01L 21/02636* (2013.01); *H01L 21/76224* (2013.01); *H01L 29/0653* (2013.01); *H01L 29/0847* (2013.01); *H01L 29/1033* (2013.01); *H01L 29/401* (2013.01); *H01L 29/41783* (2013.01); *H01L 29/6656* (2013.01); *H01L 29/66795* (2013.01); *H01L 21/0228* (2013.01); *H01L 21/26513* (2013.01); *H01L 21/31111* (2013.01); *H01L 21/32133* (2013.01); *H01L 29/4933* (2013.01)

(58) Field of Classification Search
CPC ............ H01L 29/4933; H01L 29/6653; H01L 29/6656; H01L 29/66628; H01L 29/66636; H01L 29/66795; H01L 29/7851; H01L 21/0228; H01L 21/02532; H01L 21/02598; H01L 21/0262; H01L 21/02636; H01L 21/26513; H01L 21/31111; H01L 21/32133; H01L 21/76224; H01L 2029/7858

See application file for complete search history.

(56) References Cited

U.S. PATENT DOCUMENTS

| | | | |
|---|---|---|---|
| 5,874,757 A | 2/1999 | Chao | |
| 9,048,339 B2 | 6/2015 | Cheng | |
| 10,971,499 B2 | 4/2021 | Lu | |
| 11,456,300 B2 | 9/2022 | Lu | |
| 2001/0025993 A1 | 10/2001 | Inoue | |
| 2001/0046766 A1 | 11/2001 | Asakawa | |
| 2004/0125652 A1 | 7/2004 | Hsu | |
| 2004/0184327 A1 | 9/2004 | Okuda | |
| 2005/0145952 A1* | 7/2005 | Gonzalez | H01L 29/41783 257/E29.267 |
| 2006/0131657 A1 | 6/2006 | Hamaguchi | |
| 2008/0195894 A1 | 8/2008 | Schreck | |
| 2009/0001468 A1* | 1/2009 | Shin | H01L 29/6653 257/E29.085 |
| 2009/0075029 A1* | 3/2009 | Thomas | H01L 21/02447 428/173 |
| 2010/0081244 A1 | 4/2010 | Papageorgiou | |
| 2010/0246152 A1 | 9/2010 | Lin | |
| 2011/0117732 A1* | 5/2011 | Bauer | H01L 29/66628 438/507 |
| 2012/0091469 A1 | 4/2012 | Park | |
| 2012/0104514 A1 | 5/2012 | Park | |
| 2013/0146957 A1 | 6/2013 | Cheng | |
| 2014/0084350 A1 | 3/2014 | Kim | |
| 2014/0193960 A1* | 7/2014 | Fukuda | H01L 21/76283 438/296 |
| 2015/0236157 A1 | 8/2015 | Kwok | |
| 2016/0204106 A1* | 7/2016 | You | H01L 29/0649 257/401 |
| 2018/0122956 A1 | 5/2018 | Richter | |
| 2018/0286981 A1 | 10/2018 | Jang | |
| 2018/0315851 A1 | 11/2018 | Huang | |
| 2019/0051641 A1 | 2/2019 | Lee | |
| 2019/0053406 A1 | 2/2019 | Tezuka | |
| 2020/0126882 A1 | 4/2020 | Jang | |
| 2020/0335593 A1 | 10/2020 | Lu | |

FOREIGN PATENT DOCUMENTS

| | | |
|---|---|---|
| CN | 111696987 A | 9/2020 |
| JP | 2000-31425 A | 1/2000 |
| JP | 2015-522948 A | 8/2015 |
| KR | 10-2012-0038195 A | 4/2012 |
| KR | 10-2014-0038826 A | 3/2014 |
| KR | 10-2015-0096300 A | 8/2015 |
| WO | 99/25025 A1 | 5/1999 |

\* cited by examiner

REDUCED-FORM-FACTOR TRANSISTOR WITH SELF-ALIGNED TERMINALS AND ADJUSTABLE ON/OFF-CURRENTS AND MANUFACTURE METHOD THEREOF

CROSS REFERENCE TO RELATED APPLICATIONS

This application claims the benefit of U.S. Provisional Application No. 62/771,177, filed on Nov. 26, 2018, U.S. Provisional Application No. 62/783,203, filed on Dec. 21, 2018, and U.S. Provisional Application No. 62/824,315, filed on Mar. 27, 2019, the contents of which are incorporated herein by reference.

BACKGROUND OF THE INVENTION

1. Field of the Invention

The present invention relates to a transistor, and particularly to a reduced form factor transistor with three terminals which are self-aligned in parallel and with adjustable on/off current.

2. Description of the Prior Art

The most widely used electrical Triode (a three-terminal device like transistor) is a MOSFET transistor made in a planar silicon wafer, which has its gate terminal made above the silicon wafer surface separated by a thin dielectric material like silicon-dioxide or composite high-k materials. The other two terminals, source and drain, are made into silicon underneath the silicon wafer surface. As the transistor dimensions are scaled, a fin-structure transistor (such as FinFET, Tri-gate FET, double-gate or the like) is implemented so that the transistor can continue to scale down from 22 nm to 7 nm and beyond in silicon technology. But most technologies for fin-structure transistor emphasize their current drive capability for high performance by creating high ON current rather than emphasizing low leakage current capability for low OFF current. But for deep nanometer silicon technology, the importance of using fin-structure transistors or planar transistors as low-leakage and low-power Triode devices is increasing, especially when used for switch devices in memory circuits such as in SRAM and DRAM, portable ICs or wearable ICs and the like.

For example, the most popular memory cell used for DRAM is to have one access transistor and one storage capacitor. The state-of-art behavior of using either a planar transistor or a FinFET as the access transistor suffers high leakage currents at an OFF state, such as more than one pico-Amperes per cell, which is not acceptable as it causes stored signal charges to leak away quickly, thus demanding a very short refresh time to restore the signals—otherwise the stored signals are lost. It is well known that there are many leakage current sources during OFF state, such as (a) Gate-to-Channel leakage, (b) Gate-Induced-Drain-Leakage (GIDL) leakage, (c) Drain-Induced-Barrier-lowering (DIBL) leakage, (d) Sub-threshold Channel Leakage, (e) Source/Drain sidewall or Area Leakage due to p-n junction in Silicon materials, etc. In order to meet a very low OFF current target near femto-Amperes level per device, some transistor size parameters must be relaxed to unacceptable tolerances, which disobeys the scaling theory that requires shrinking the transistor dimensions in order to reduce the cell size for achieving Moore's Law economy. In an exaggerated example, for a 10-nanometer technology, the transistor gate length must be over 100 nanometers in order to reduce OFF current for meeting the fA/cell requirement, which is impractical.

Therefore, there is a need to provide a new transistor with scalable structure for achieving Moore's Law economy and with adjustable OFF current for achieving low leakage current during OFF state.

SUMMARY OF THE INVENTION

Therefore, this invention discloses a new transistor design, regardless of either a planar, a 3D, or a fin-structure (such as FinFET, Tri-gate FET, double-gate or the like), which can significantly reduce the aforementioned leakage current magnitudes and allow scaling down of the transistor size including a shrinkable gate length, that is, the gate length can be designed to be as short as the minimum feature size that lithography/etching can print or create, respectively. In addition, the contact regions of gate, source and drain terminals of the new transistor have mutual self-alignment features, thus allowing a more compact planar area and smaller form-factor than the conventional transistor structures of the same breed.

According to one object of the invention, a transistor structure is provided to comprise a gate structure, a channel region, a drain region and a source region. The gate structure is positioned above a silicon surface of a first silicon material, the channel region is under the silicon surface, and the channel region includes a first terminal and a second terminal. Moreover, the drain/source region is independent and not derived from the first silicon material, the drain region includes a first predetermined physical boundary directly connected to the first terminal of the channel region, and the source region includes a second predetermined physical boundary directly connected to the second terminal of the channel region.

According to an aspect of the invention, the transistor structure comprises a spacer covering sidewalls of the gate structure, wherein the first predetermined physical boundary of the drain region is aligned with a first edge of the spacer and the second predetermined physical boundary of the source region is aligned with a second edge of the spacer. Moreover, the transistor structure includes a first concave with a first side barrier, wherein the drain region includes a lower portion in the first concave and an upper portion stacked on the lower portion and contacting with the spacer, and the first side barrier is aligned with the first predetermined physical boundary of the drain region. Furthermore, a first isolator is positioned on the bottom of the first concave and the lower portion of the drain region is above the first isolator, wherein the lower portion of the drain region is directly connected to the first terminal of the channel region. When the silicon surface of a first silicon material is a top surface of a fin structure and the first concave is formed in the fin structure, the thickness of the lower portion of the drain region or the thickness of the channel region is independent from the thickness of the fin structure.

It maybe one object of the invention to provide a transistor structure comprising a gate conductive region extending upward from a gate insulator positioned above a silicon surface, a spacer covering sidewalls of the gate conductive region, a channel region under the silicon surface, and a first conductive region including an upper portion and a lower portion. The spacer is positioned above the silicon surface. The length of the channel region is larger than the length of the gate conductive region. The first conductive region extends upward from a first isolator to a first top surface. The lower portion of the first conductive region contacts with the channel region, the upper portion of the first conductive region contacts with a first side of the spacer, and the width of the first conductive region is substantially the same as the width of the first isolator.

According to an aspect of the invention, the transistor structure further comprises a second conductive region which includes an upper portion and a lower portion, and the upper portion of the second conductive region extends upward from a second isolator to a second top surface. The lower portion of the second conductive region contacts with the channel region, the upper portion of the second conductive region contacts with a second side of the spacer, and the width of the second conductive region is substantially the same as the width of the second isolator. Moreover, the channel region extends horizontally from the second side of the spacer to the first side of the spacer.

According to another aspect of the invention, the top surface of the first conductive region is higher than the top of the gate conductive region, and the top surface of the second conductive region is higher than the top of the gate conductive region. According to another aspect of the invention, the thickness of the lower portion of the first conductive region is between 5 nm and 20 nm, and the thickness of the lower portion of the second conductive region is between 5 nm and 20 nm. According to another aspect of the invention, the transistor structure further comprises a cap structure positioned above the gate conductive region, wherein the top surface of the first conductive region is not higher than the top of the cap structure, and the top surface of the second conductive region is not higher than the top of the cap structure. According to another aspect of the invention, the upward extending directions of the gate conductive region, the first conductive region and the second conductive region are perpendicular or substantially perpendicular to the silicon surface.

It maybe one object of the invention to provide a transistor structure comprising a fin structure with a top silicon surface, a gate structure coupled to the fin structure, a spacer covering a first sidewall of the gate structure and a second sidewall of the gate structure, a first concave formed in the fin structure, a first isolator formed in the first concave, and a first conductive region extending upward from the first isolator to a first top surface. The top of the gate structure is higher than the top silicon surface. The bottom of the first concave is lower than the top silicon surface. The top of the first isolator is lower than the silicon surface. The first conductive region includes a lower portion and an upper portion vertically tiered above the lower portion. Wherein, the first conductive region abuts against the portion of the spacer covering the first sidewall of the gate structure, and the first conductive region has a first predetermined doping concentration profile along an upward extension direction of the first conductive region.

According to an aspect of the invention, the transistor structure further comprises a second concave formed in the fin structure, a second isolator formed in the second concave, and a second conductive region extending upward from the second isolator to a second top surface. Wherein, the bottom of the second concave is lower than the silicon surface, the top of the second isolator is lower than the silicon surface, the second conductive region includes a lower portion and an upper portion vertically tiered above the lower portion, the second conductive region abuts against the portion of the spacer covering the second sidewall of the gate structure, and the second conductive region has a second predetermined doping concentration profile along an upward extension direction of the second conductive region. Furthermore, the transistor structure further comprises a channel region under the top silicon surface, wherein the channel region includes a first terminal and a second terminal, and the first concave is adjacent to the first terminal of the channel region and the second concave is adjacent to the second terminal of the channel region. In addition, the lower portion of the first conductive region is below the top silicon surface and contacts with the first terminal of the channel region, and the lower portion of the second conductive region is below the top silicon surface and contacts with the second terminal of the channel region.

According to another aspect of the invention, the transistor structure further comprises a cap structure positioned above the gate structure, wherein the top surface of the first conductive region is not higher than the top of the cap structure, and the top surface of the second conductive region is not higher than the top of the cap structure. According to another aspect of the invention, the thickness of the first concave is in the range of 20 nm to 50 nm, and the thickness of the second concave is in the range of 20 nm to 50 nm.

According to another aspect of the invention, the transistor structure further comprises a first gate structure coupled to the fin structure, a first spacer above the top silicon surface and aligned with an edge of the first concave, a second gate structure coupled to the fin structure, and a second spacer above the top silicon surface and aligned with an edge of the second concave. Wherein, the first spacer covers a sidewall of the first gate structure, the second spacer covers a sidewall of the second gate structure, and the first conductive region abuts against the first spacer and the second conductive region abuts against the second spacer. Moreover, the lower portion of the first conductive region is below the silicon surface and the bottom of the lower portion of the first conductive region is confined to the first isolator, and sidewalls of the first conductive region are confined to the spacer and the first spacer except sidewalls of the lower portion of the first conductive region. The lower portion of the second conductive region is below the top silicon surface and the bottom of the lower portion of the second conductive region is confined to the second isolator, and sidewalls of the second conductive region are confined to the spacer and the second spacer except sidewalls of the lower portion of the second conductive region.

According to another object of the invention is to provide a manufacture method for a transistor structure, the manufacture method comprises: preparing a first silicon material; forming a gate structure coupled to the first silicon material; and forming a drain region with a first controllable doping concentration profile and a source region with a second controllable doping concentration profile, wherein no ion-implementation process is used between forming the gate structure and forming the drain region and the source region. Moreover, (1) a spacer is formed to cover sidewalls of the gate structure and being above a silicon surface; (2) a first concave with a first side barrier and a second concave with a second side barrier are also formed, wherein the first side barrier of the first concave is aligned with a first edge of the spacer and the second side barrier of the second concave is aligned with a second edge of the spacer; and (3) a first isolator is formed on the bottom of the first concave and a second isolator is formed on the bottom of the second concave. The drain region includes a lower portion in the first concave and stacked on the first isolator, and the drain region further includes an upper portion stacked on the lower portion and contacting with the spacer. Also, the source region includes a lower portion in the second concave and stacked on the second isolator, and the source region further includes an upper portion stacked on the lower portion and contacting with the spacer.

According to another object of the invention is to provide a manufacture method for a transistor structure, the manufacture method comprises: preparing a first silicon material with a channel region; forming a gate structure above the channel region; and forming a drain region with a first controllable doping concentration profile and a source region with a second controllable doping concentration profile, wherein the drain region includes a first predetermined physical boundary connected to a first terminal of the channel region, and the source region includes a second predetermined physical boundary connected to a second terminal of the channel region. Furthermore, (1) a spacer is formed to cover sidewalls of the gate structure and being above a silicon surface; (2) a first concave with a first side barrier and a second concave with a second side barrier are formed, wherein the first side barrier of the first concave is aligned with a first edge of the spacer and the second side barrier of the second concave is aligned with a second edge of the spacer, and wherein the first side barrier of the first concave is aligned with the first predetermined physical boundary of the drain region, and the second side barrier of the second concave is aligned with the second predetermined physical boundary of the source region; (3) a first isolator is formed on the bottom of the first concave and a second isolator is formed on the bottom of the second concave, wherein the drain region includes a lower portion in the first concave and stacked on the first isolator, the drain region further includes an upper portion stacked on the lower portion and contacting with the spacer. Moreover, the lower portion of the drain region could be formed by SEG method from a portion of the first side barrier not blocked by the first isolator.

It may be that one object of the invention is to provide a manufacture method for a transistor structure, the manufacture method comprises: preparing a first silicon material with a channel region; forming a gate structure above the channel region; and forming a vertical drain region with a first controllable doping concentration profile and a vertical source region with a second controllable doping concentration profile, wherein no ion-implanted zone is formed between a first terminal of the channel region and the drain region, and no ion-implanted zone is formed between a second terminal of the channel region and the source region. The first controllable doping concentration profile from the bottom to the top of the vertical drain region includes: (1) a lightly doped zone, a normal doped zone, a greater doped zone and a heavily doped zone; (2) a normal doped zone, a lightly doped zone, a greater doped zone, and a heavily doped zone; or (3) an un-doped zone, a normal doped zone, a greater doped zone and a heavily doped zone.

The advantages and spirits of the invention may be understood by the following recitations together with the appended drawings.

These and other objectives of the present invention will no doubt become obvious to those of ordinary skill in the art after reading the following detailed description of the preferred embodiment that is illustrated in the various figures and drawings.

DETAILED DESCRIPTION

A detailed description of the hereinafter described embodiments of the disclosed apparatus and method is presented herein by way of exemplification and not limitation with reference to the Figures. Although certain embodiments are shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of embodiments of the present invention.

Figure 1:
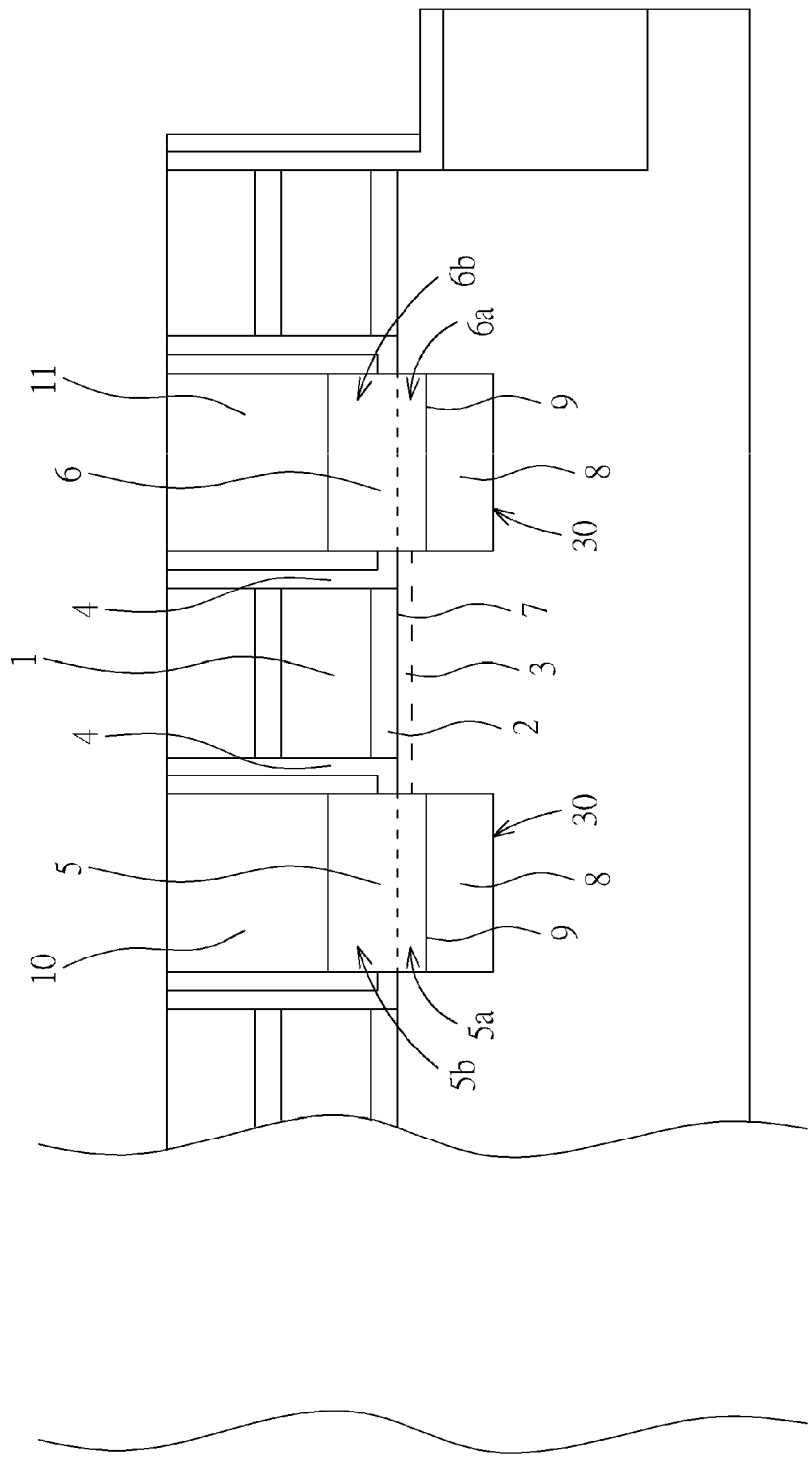
FIG. 1 illustrates a cross-section view of the proposed new transistor structure.

The proposed new transistor structure (hereinafter called NQT) is shown in FIG. 1. It reduces the planar-area size by fully utilizing the third dimension in the vertical height and making three-terminals mutually self-aligned so as to keep the transistor size to be scalable in terms of occupying a smaller form-factor even up to the final level of making the contact regions of source, drain and gate, respectively. It further reduces several possible leakage currents by using insulators (such as oxide, nitride, etc.) to isolate most junction areas except the essential connection to the exposed silicon channel area, but still maintains using a silicon bulk-substrate connected to ground or a negatively biased voltage without using SOI (Silicon-on-Insulator, associated with higher cost and complex to design). More importantly, the gate length can be as short as approximately the minimum feature size, and most various leakage mechanisms such as GIDL, DIBL, sub-threshold leakage and most leakage through the p-n junction are significantly reduced. An additional novelty is that both source and drain resistances are adjustable not only by changing doping concentrations or modifying structures, but also by designing various physical dimensions including the height, the width, and the length of this newly disclosed vertical source/drain structures (which can be more accurately controlled in process to the targets).

Please refer to FIG. 1 which is a cross-section view, this new transistor structure has a vertical gate 1 over a dielectric 2 on top of silicon channel region 3 and spacers 4 surrounding two sides of the gate structure 1. The spacer 4 can be single layer or multiple layers comprising nitride, oxide, or nitride/oxide and the like, etc. The transistor features two vertical source 5 and drain 6 by special processing techniques to shape them like pillars attached next to the spacers 4, thus resulting in having the vertical gate 1 and both vertical source 5 and drain 6 of all three terminals in self-alignment in parallel. These vertical source and drain pillars are made to have some portions like the root portions of theirs 5a, 6a below the silicon surface 7, and the vertical source and drain pillars are on top of insulator regions 8. The insulator regions 8 comprises oxide, nitride, or other insulators which could be grown by Atomic-Layer-Deposition ALD technique, or the like. These insulator regions 8 are designed and made underneath the vertical source and drain pillars for reducing the junction areas owing to the bottom portions 9 of both source 5 and drain 6 located inside the silicon substrate. Some portions of the vertical source and drain pillars 5b and 6b are made vertically above the silicon surfaces 7, respectively. Some highly conductive portion of source and drain regions 10 and 11 are made in self-alignment technique as natural continual connection regions on top of respective vertical source and drain pillars and are also used for contact regions for future interconnects.

The silicon surface could be the silicon substrate surface when the new transistor is a planar transistor, or could be the top surface of the fin structure when the new transistor is a FinFET or tri-gate transistor. As shown in FIG. 1, the source region extends downward from the silicon surface 7 to the insulator region 8 (for example, the root portion 5a of the source region which is below the silicon surface 7), and also extends upward from the silicon surface 7 (for example, the portion 5b of the source region and the highly conductive portion 10 of source region which are above the silicon surface 7). The upward or downward extending directions of the source region is perpendicular or substantially perpendicular to the silicon surface 7. Similarly, the drain region extends downward from the silicon surface 7 to the insulator region 8 (for example, the root portion 6a of the drain region which is below the silicon surface 7), and also extends upward from the silicon surface 7 (for example, the portion 6b of the drain region and the highly conductive portion 11 of drain region which are above the silicon surface 7). The upward or downward extending directions of the drain region is perpendicular or substantially perpendicular to the silicon surface 7. The gate 1 also extends upward from the dielectric 2 on top of silicon channel region 3, and the upward extending directions of the gate region is perpendicular or substantially perpendicular to the silicon surface 7. The insulator region (or isolator) 8 covers the bottom of a concave 30.

In one embodiment, the extending directions of the gate, source and drain are in parallel or substantially parallel. The top surface of the portion 6b of the drain region which is above the silicon surface 7 could be higher or lower than the top surface of the gate 1, however, the top surface of the highly conductive portion 11 of drain region is higher than the top surface of the gate 1. Similarly, the top surface of the portion 5b of the source region which is above the silicon surface 7 could be higher or lower than the top surface of the gate 1, however, the top surface of the highly conductive portion 10 of source region is higher than the top surface of the gate 1. In another embodiment, the width of the source (or drain) region is substantially the same as that of the insulator region 8, as shown in FIG. 1. The silicon channel region 3 extends horizontally from the root portion 5a of the source region to the root portion 6a of the drain region, and the length of the silicon channel region 3 is longer than that of the gate 1. For example, the silicon channel region 3 is not only beneath the gate 1, but also beneath the spacers 4. Moreover, the thickness of the silicon channel region 3 is shorter than that of the root portion 5a of the source region (or the root portion 6a of the drain region). In another embodiment, the sum of the thickness of the root portion 5a of the source region (or the root portion 6a of the drain region) plus the thickness of the insulator region 8 is from 20 nm to 50 nm. The thickness of the root portion 5a of the source region (or the root portion 6a of the drain region) is adjustable, such as between 5 nm and 20 nm.

When the thickness of the fin structure is between 20 nm to 30 nm and the concave is formed in the fin structure, the bottom of the concave could be lower than or higher than the bottom of the fin structure since there is isolator positioned on the bottom of the concave to prevent from current leakage. Moreover, due to controllable thickness of the insulator region 8 positioned on the bottom of the concave, the thickness of the root portion 5a of the source region (or the root portion 6a of the drain region) is also adjustable and independent from the thickness of the fin structure. Moreover, the thickness of the channel region is also independent from the thickness of the fin structure.

How to design this new transistor in order to minimize the OFF current level is described as follows (use NMOS as an example). First, select the gate material with an appropriate work function (from 4.0 eV to 5.2 EV, such as p+ doped polysilicon gate or one selected out of various metal-gate materials) to reduce the electric field across the gate dielectric 2 to the channel region 3 which is non-, lightly- or medium- boron-doped. Then the vertical source/drain regions 5 and 6 are formed with the right resistances caused by preferred or selected height, width and length, as well as selected various doping concentrations with suitable opening areas below the silicon surface 7 in connection to the channel region 3. The channel region 3 is doped with appropriate concentration. For example, an OFF state of a 1T-1C cell to have very low leakages could be achieved as follows: a high voltage ONE such as VDD of array bias voltage on the drain, a ZERO such as 0V or negative voltage is sourced, and the cell substrate voltage can be negatively biased to avoid noise voltage spikes to trigger the source and/or drain junctions shortly turned on. The VDD voltage will be reduced by the resistance control of the vertical source/drain region 5 and 6 to cause lower voltage to distribute to the channel region 3, the effective channel length is in fact longer than the physical gate length since the vertical source and drain 5 and 6 are separated by not only the gate length but an addition of the silicon regions below the spacer regions 4, and the insulator columns 8 below vertical source and drain regions 5 and 6 further reduce unwanted parasitic capacitance and leakage areas due to small p-n junction isolations.

The processing methods of achieving such an innovative self-alignment feature of the NQT structure are disclosed here to show their novelty but have only added or modified a few steps into to the state-of-the-art processing steps for manufacturing either deep-nanometer fin-structure transistors or advanced planar transistors. There should be more than one silicon-technology processing method to achieve the NQT structure, but the following is the preferred one to illustrate how the key features and attributes are made by key processing steps and complete architectures as described in association with this unique NQT structure.

(1) First, grow oxide-1 layer over a p-type silicon wafer substrate (which can also be the p-well of either a triple-well or twin-well structure and the like). Then deposit a layer of Nitride-1. Then use a photolithography method to define active regions for positions of future transistors to be made. Outside these active regions, etch away silicon material, and use thermally grown Oxide-2 (or deposited oxide and the like) to form a STI (shallow trench isolation) whose surface is about 25 to 30 nm below the silicon surface, and the STI thickness can be another 300-1000 nm deeper into the silicon substrate.

Figure 2:
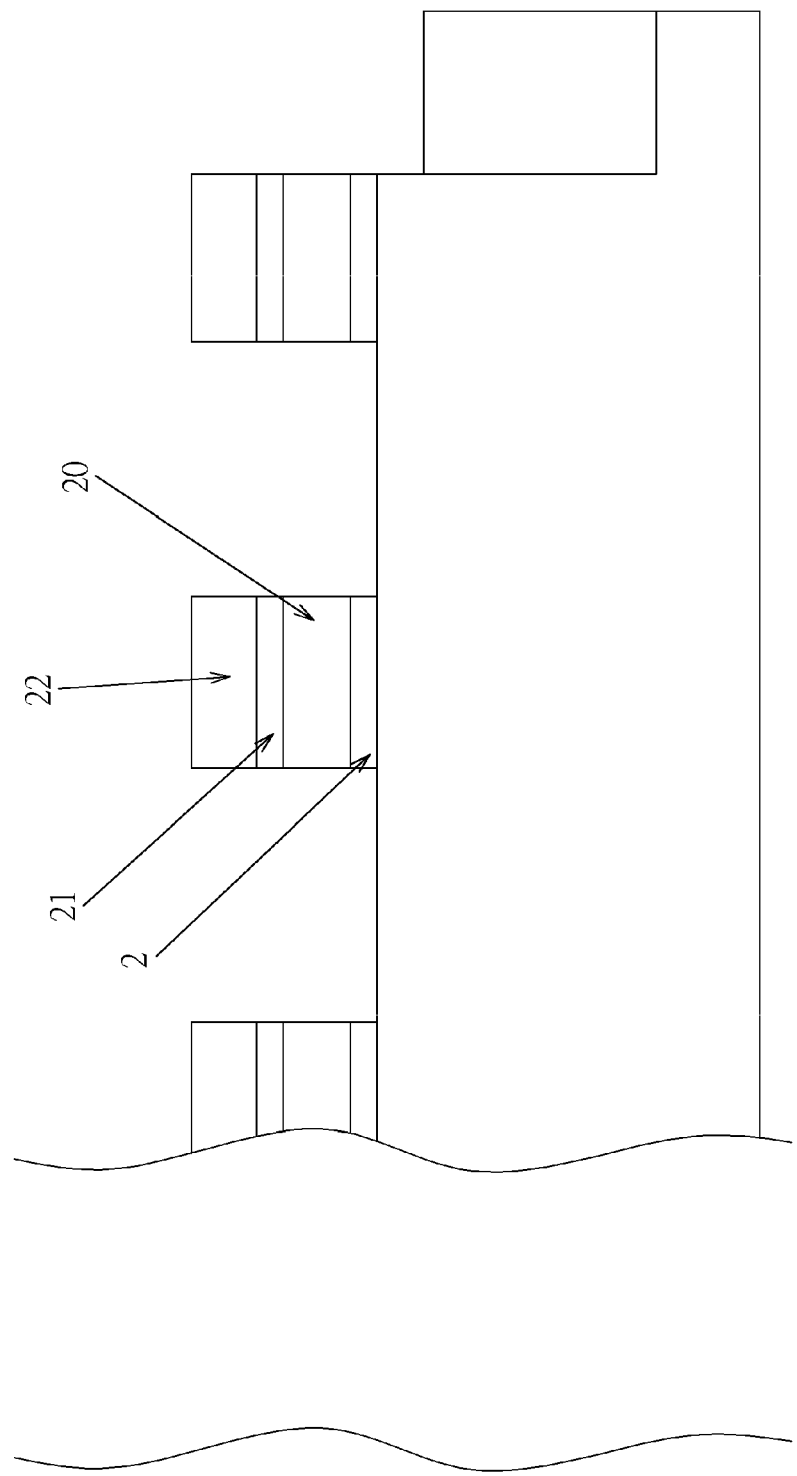
FIG. 2 illustrates a cross-section view following an etching step for making a vertical gate over gate dielectric or insulator on a transistor channel region.

(2) Remove Nitride-1 and Oxide-1 to expose the silicon surface of the active region for the transistor to be made in. Form the dielectric layer as the gate insulator or dielectric 2 of the fin structured transistor or planar transistor, which can be thermally grown oxide layer, oxide and composite insulation material, high-k material or the like. Then complete a channel doping process which uses implantation of p-type dopants (such as Boron, BF2 or the like) into the transistor channel and active regions for source and drain. Then deposit a thick layer of polysilicon 20 (such as doped polysilicon, polysilicon+ silicide material, metal or the like) as gate material over the silicon surface 7, and subsequently form a nitride-2 layer 22 over an oxide-2 layer 21 over the polysilicon 20. Then use a lithography masking step to define the shape of the gate 1 and its connection area, and use an anisotropic etching technique to form the patterns of nitride-2 layer 22/oxide-2 layer 21/polysilicon 20 which show a vertical gate over gate dielectric or insulator 2 on the transistor channel region, as shown in FIG. 2.

Figure 3:
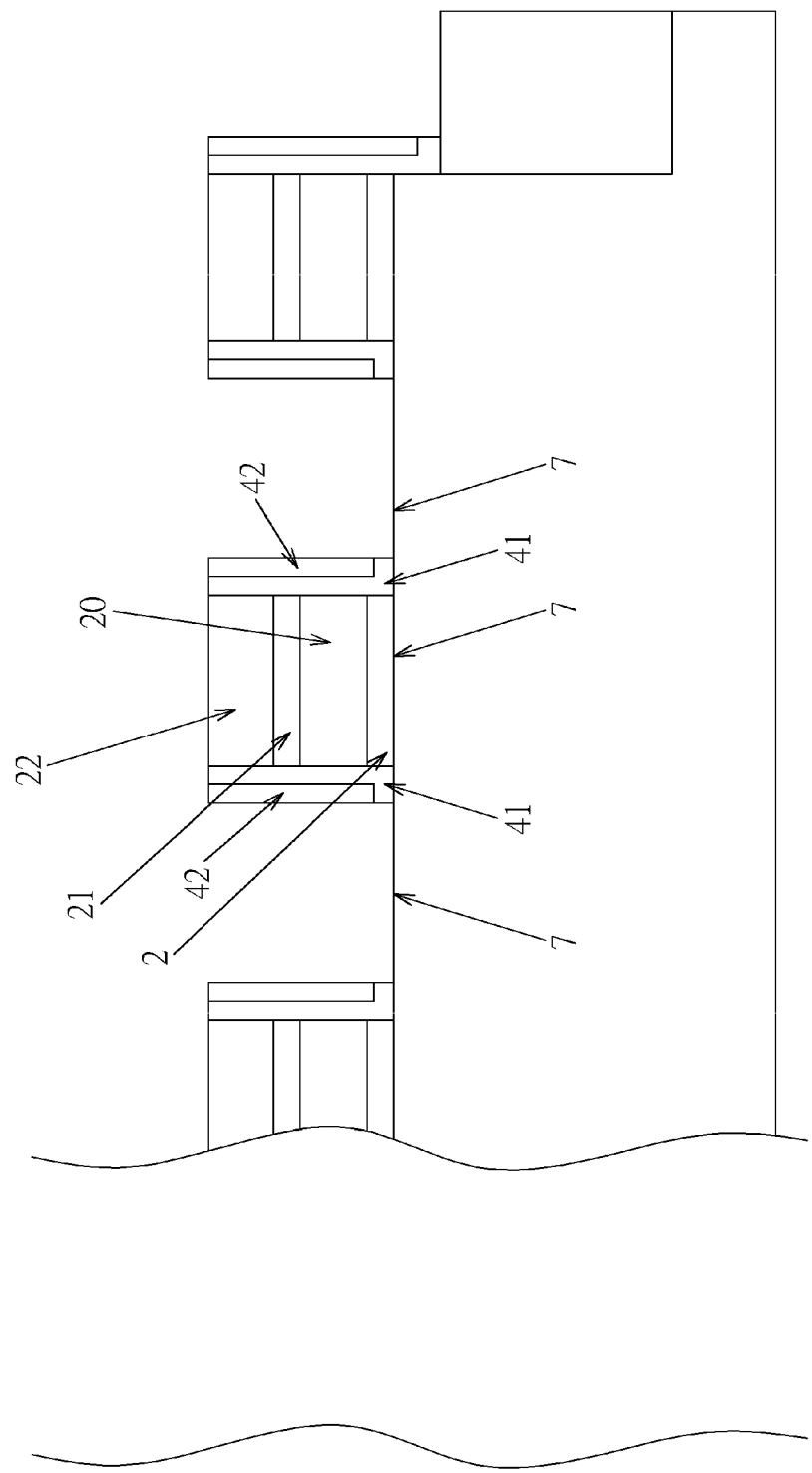
FIG. 3 illustrates a cross-section view following a forming step of spacers surrounding two sidewalls of the vertical gate shown in FIG. 2.

(3) Thereafter, form an oxide-3 layer 41 and then a nitride-3 layer 42 over the entire silicon surface. Use an anisotropic etching technique to form spacers 4 (Nitride-3/Oxide-3 composite layers) surrounding the two sidewalls of the gate 1, as shown in FIG. 3.

Figure 4A:
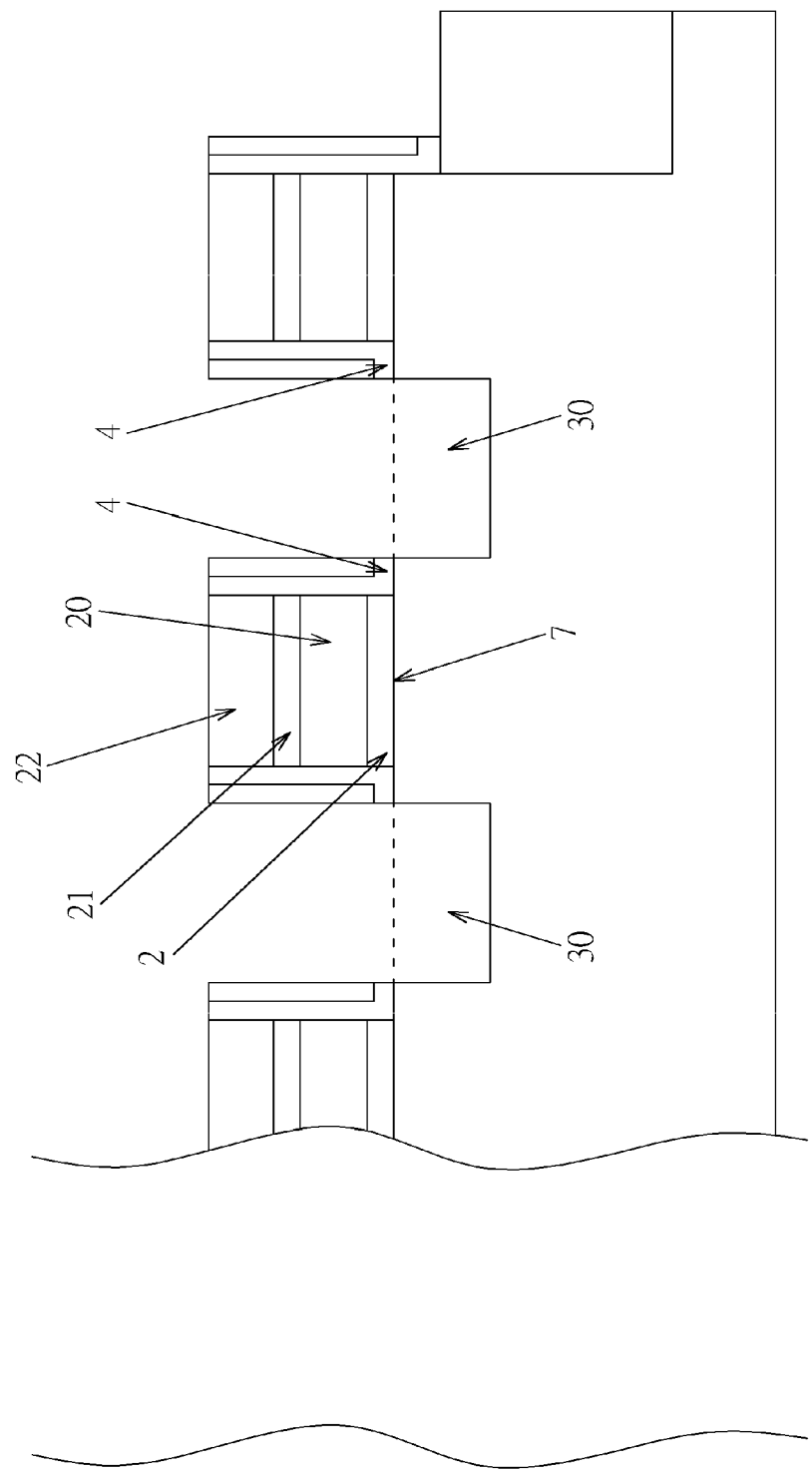
FIG. 4A illustrates a cross-section view following an etching step for making a concave area for source and drain according to a first embodiment of the present invention.
Figure 4B:
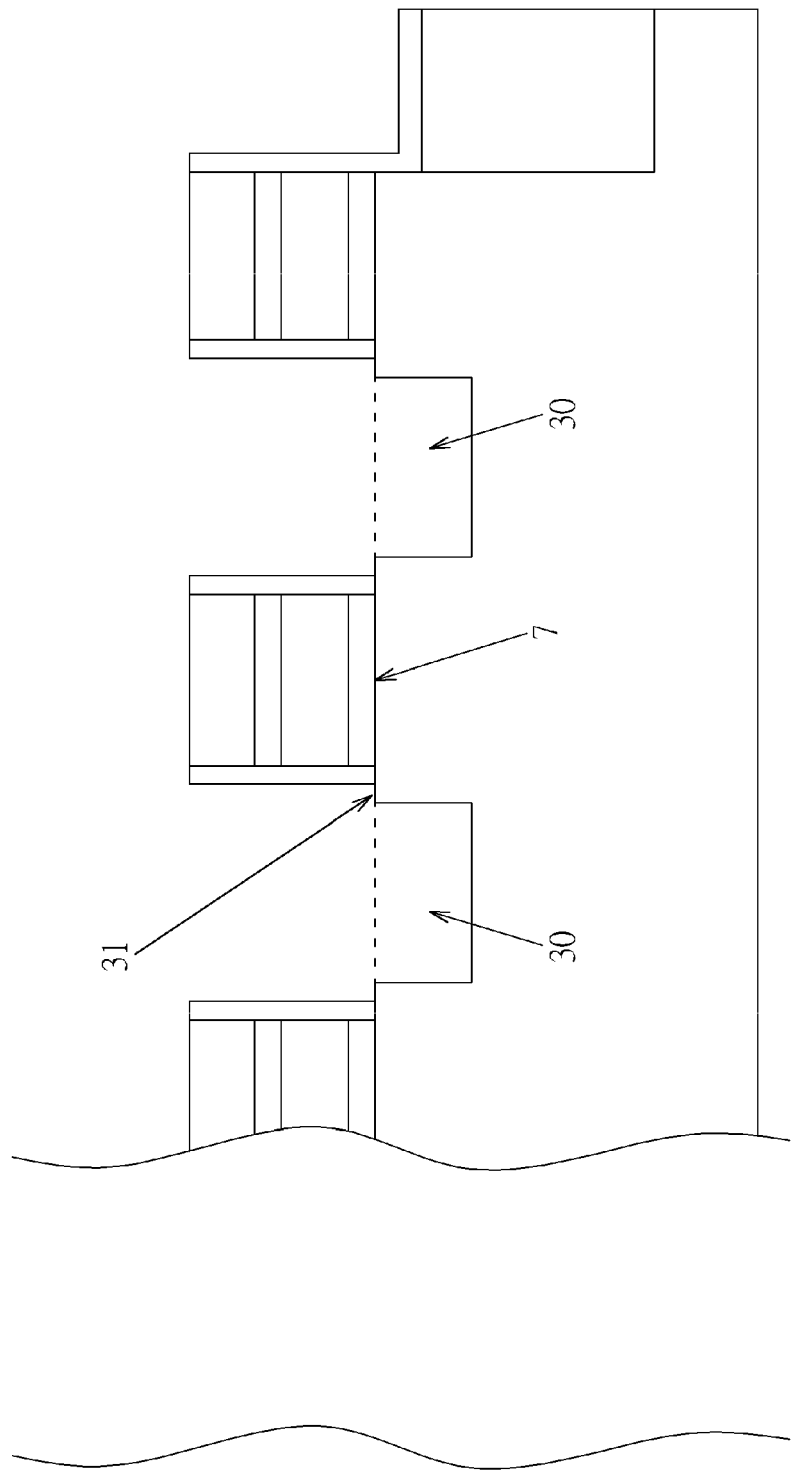
FIG. 4B illustrates a cross-section view following an etching step for making a concave for source and drain according to a second embodiment of the present invention.

(4) Then by using these spacers 4 as a mask, the exposed silicon active areas for source and drain is etched away by an anisotropic etching technique to create a concave area 30 which has its bottom well designed in a depth (e.g. in 20 nanometers, or between 15-30 nanometers for design requirements), as shown in FIG. 4A. There can be an alternative solution by adding one more step to etch back some portion of the Nitride-3 layer to expose some silicon area 31 on the silicon surface, as shown in FIG. 4B. In the following, the manufactured structures in FIGS. 5A, 6A, 7A, 8A and 9 are based on the structure in FIG. 4A, and the manufactured structures in FIGS. 5B, 6B, 7B, and 8B are based on the structure in FIG. 4B.

Figure 5A:
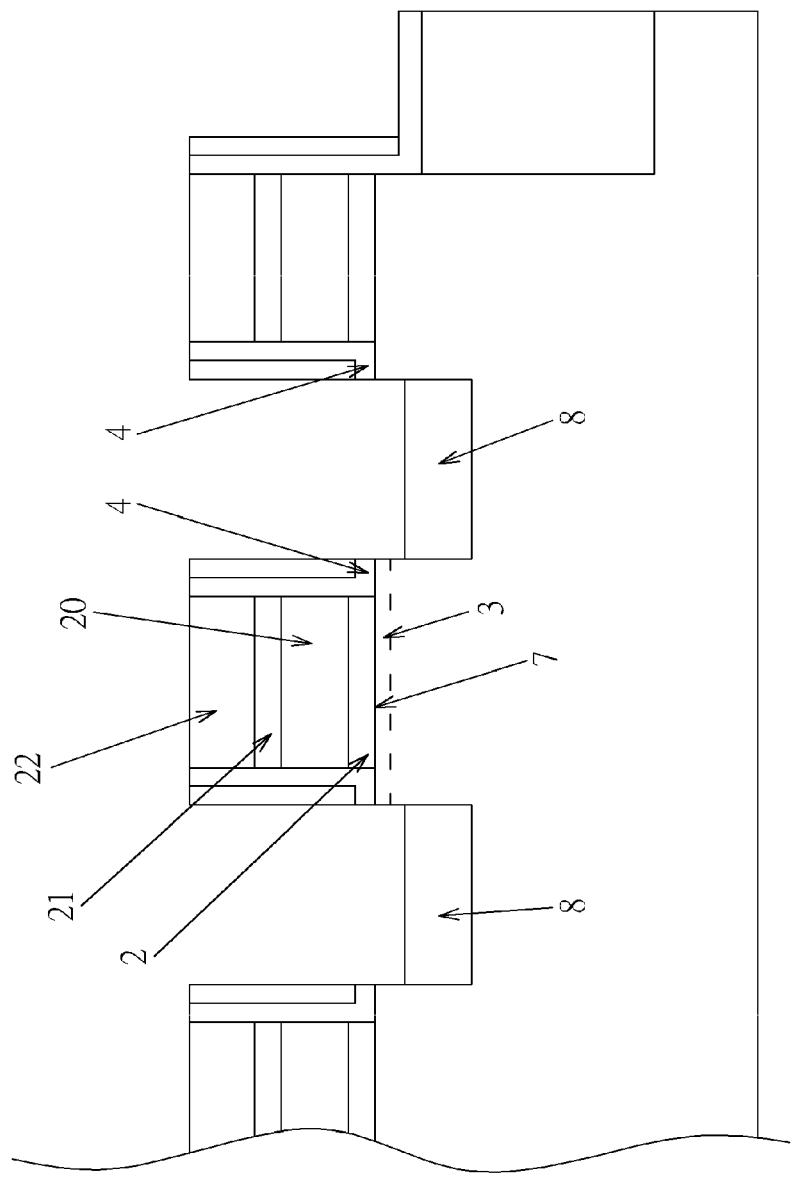
FIG. 5A illustrates a cross-section view following a step for filling an isolation material inside the concave based on the structure in FIG. 4A.
Figure 5B:
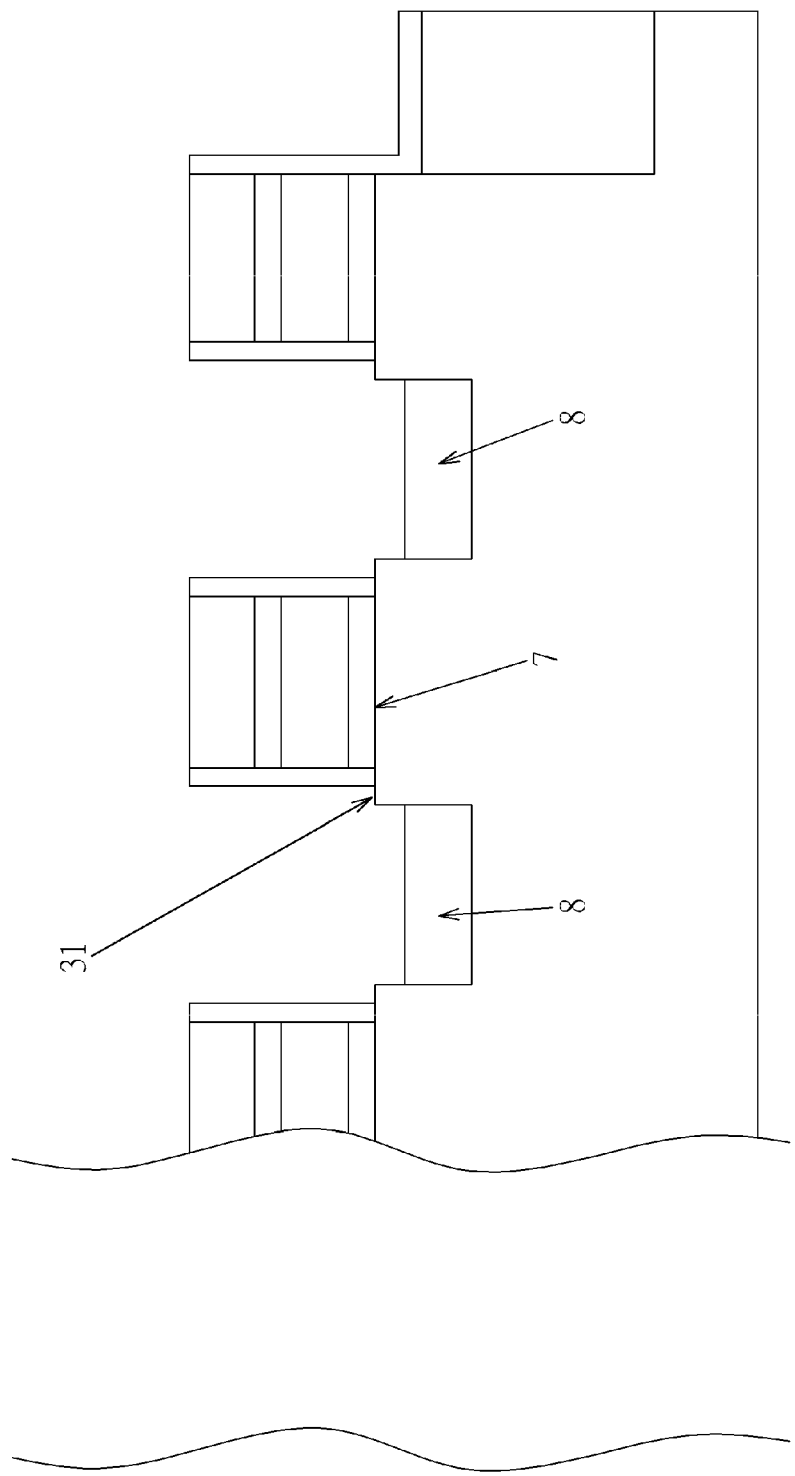
FIG. 5B illustrates a cross-section view following a step for filling an isolation material inside the concave based on the structure in FIG. 4B.
Figure 6A:
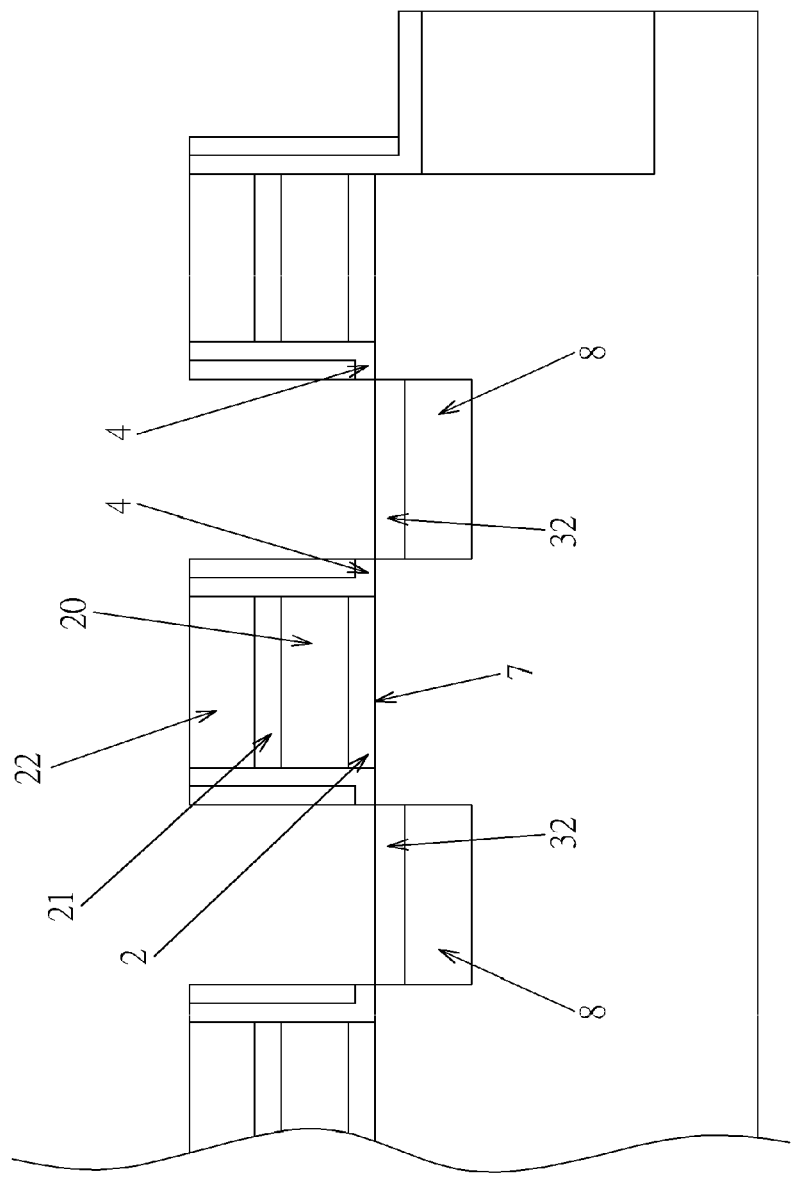
FIG. 6A illustrates a cross-section view following a dock forming step to grow a layer of single-crystalline silicon laterally over the surface of the concave based on the structure in FIG. 4A.
Figure 6B:
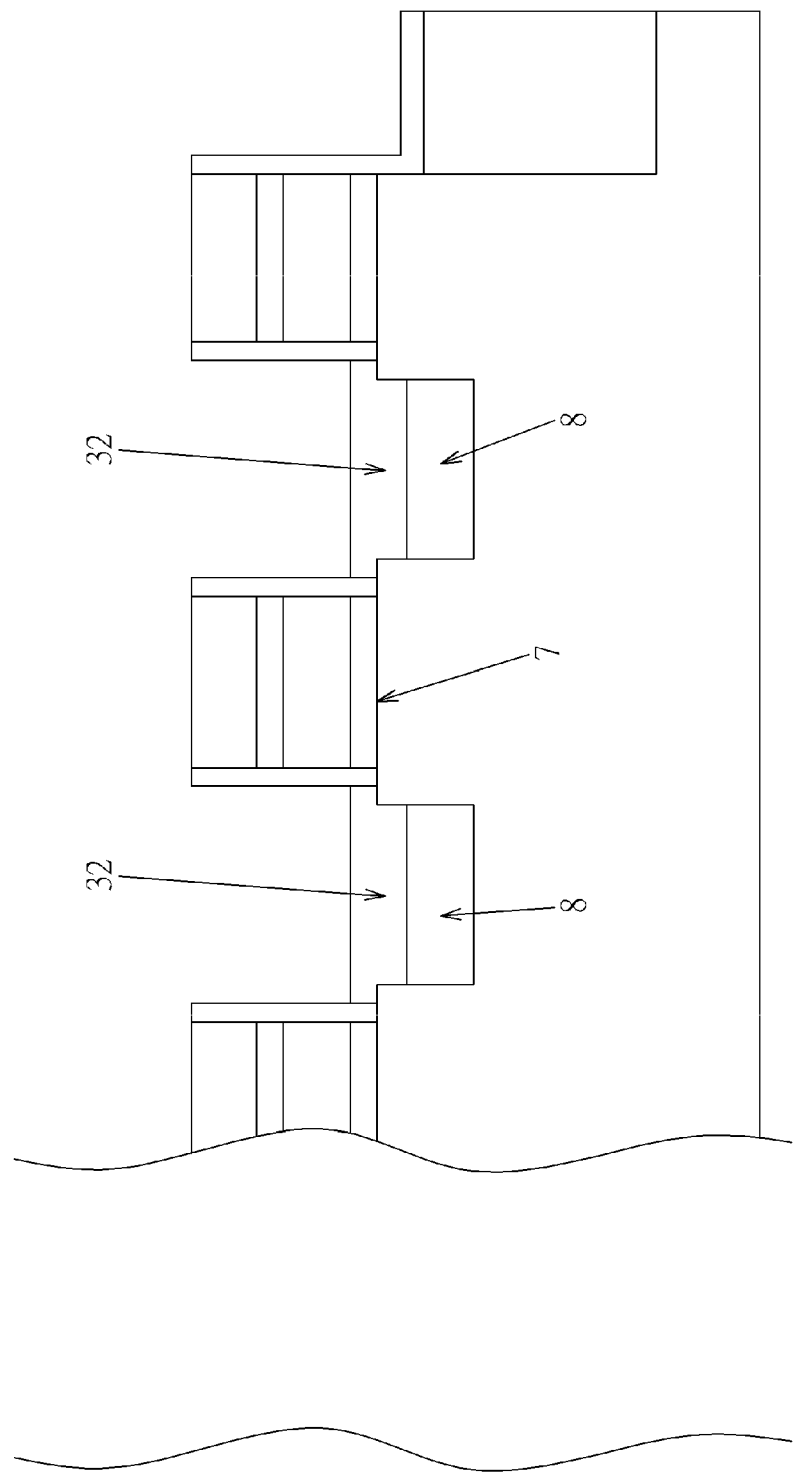
FIG. 6B illustrates a cross-section view following a dock forming step to grow a layer of single-crystalline silicon laterally over the surface of the concave based on the structure in FIG. 4B.

(5) Then deposit or grow isolation material 8 (high-k material or oxide-4) to fill in the concave 30 and then etch back, such that the surface of the isolation material 8 is lower than the silicon surface 7, as shown in FIG. 5A and 5B. Therefore, the silicon channel region underneath the spacer 4 has its sidewall along the transistor width direction fully exposed.

(6) Then use SEG (Selective-Epitaxy-Growth) technique with this silicon on the exposed sidewall of the concave 30 as the silicon-growth seeding to grow a layer of single-crystalline silicon laterally over the surface of the concave 30 (any other technique such as ALD which should grow similar lateral single-crystalline silicon as expected), as shown in FIGS. 6 A and 6B. This important lateral silicon seeding area is named as dock 32. In order to improve the quality and the stability of the single-crystalline, the grown silicon could be treated by laser-annealing (or rapid thermal annealing, and like). How to design the single-crystalline silicon shapes needed depends on how the resistance and voltage/electric-field distribution effect is desired, which can effectively control the On/Off current adjustment to the desired transistor characteristics.

Figure 7A:
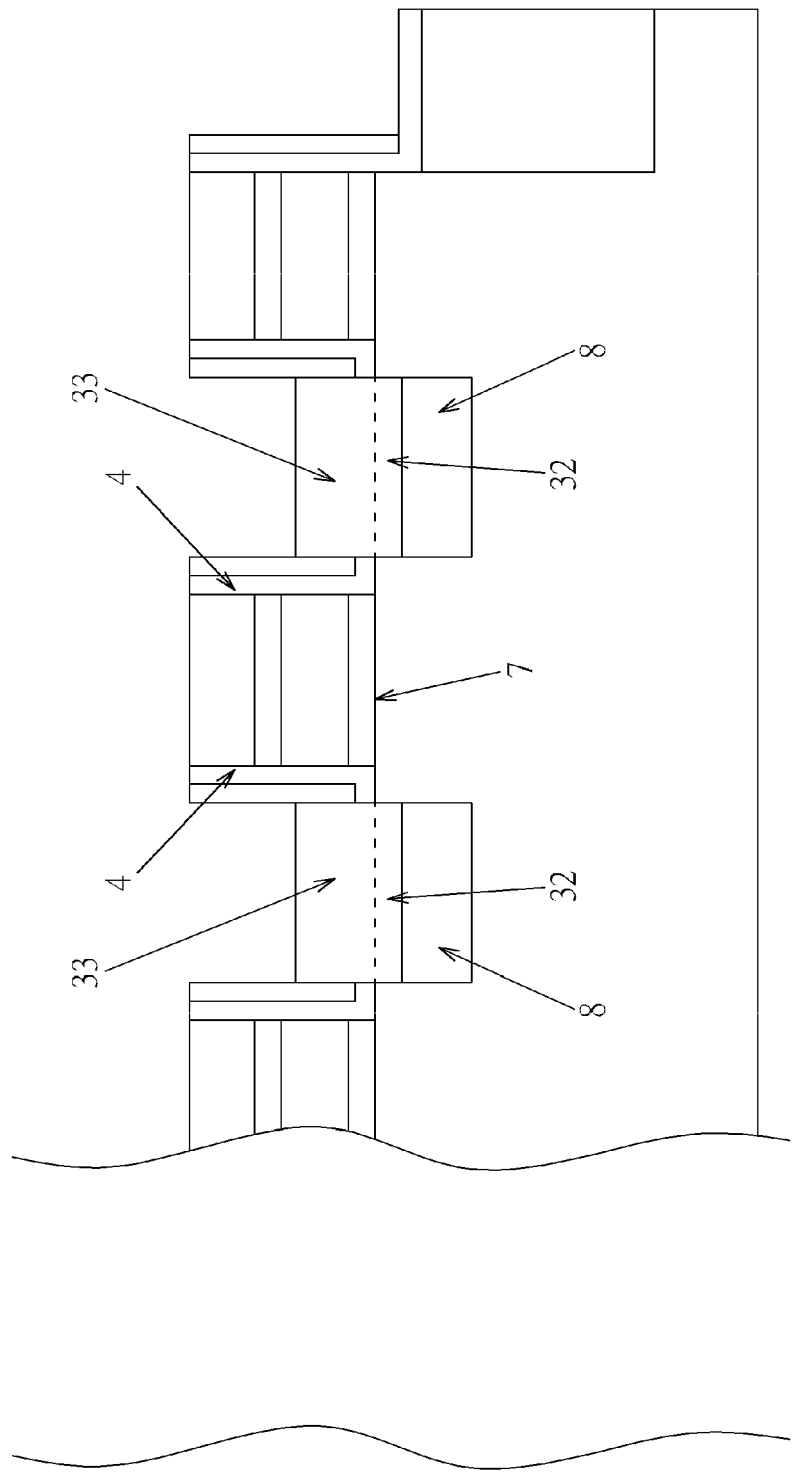
FIG. 7A illustrates a cross-section view following a silicon pillar forming step to grow single-crystalline silicon vertically along the spacers on the sidewalls of the gate based on the structure in FIG. 4A.
Figure 7B:
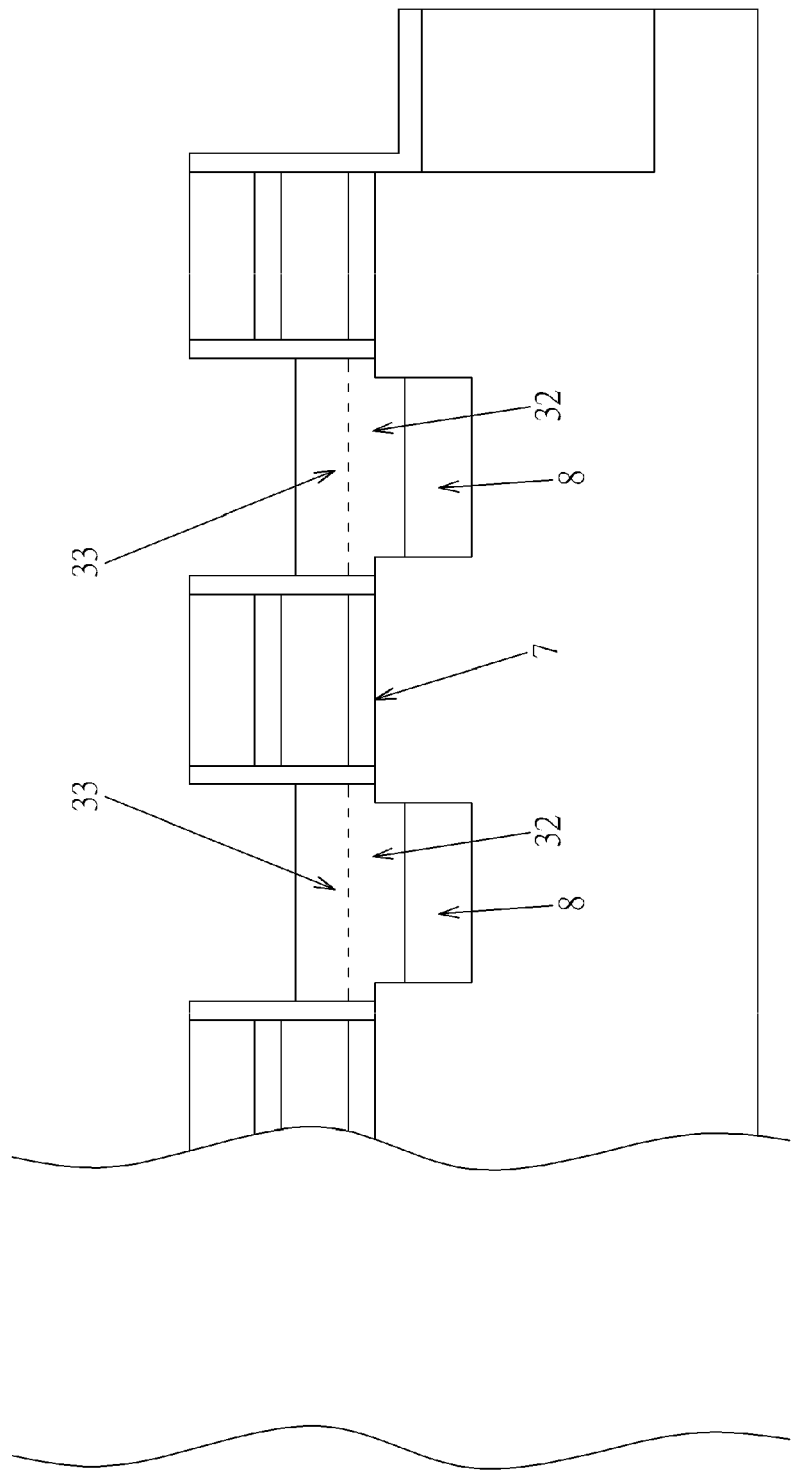
FIG. 7B illustrates a cross-section view following a silicon pillar forming step to grow single-crystalline silicon vertically along the spacers on the sidewalls of the gate based on the structure in FIG. 4B.

(7) By using this dock 32, a silicon pillar 33 can thus be formed by continuous growth of single-crystalline silicon vertically along the spacers 4 on the sidewalls of the gate only, since the width of the pillar 33 is well controlled by the width opening of the lateral silicon seeding area, as shown in FIGS. 7A and 7B. The height of the silicon pillars 33 can be well controlled and various mechanisms can be designed (e.g. different kinds of doping concentration profile, a mixture of other non-silicon materials such as Germanium or Carbon atoms, etc.). In another example, dock 32 and silicon pillars 33 can be formed by deposition method, such as ALD.

Figure 8A:
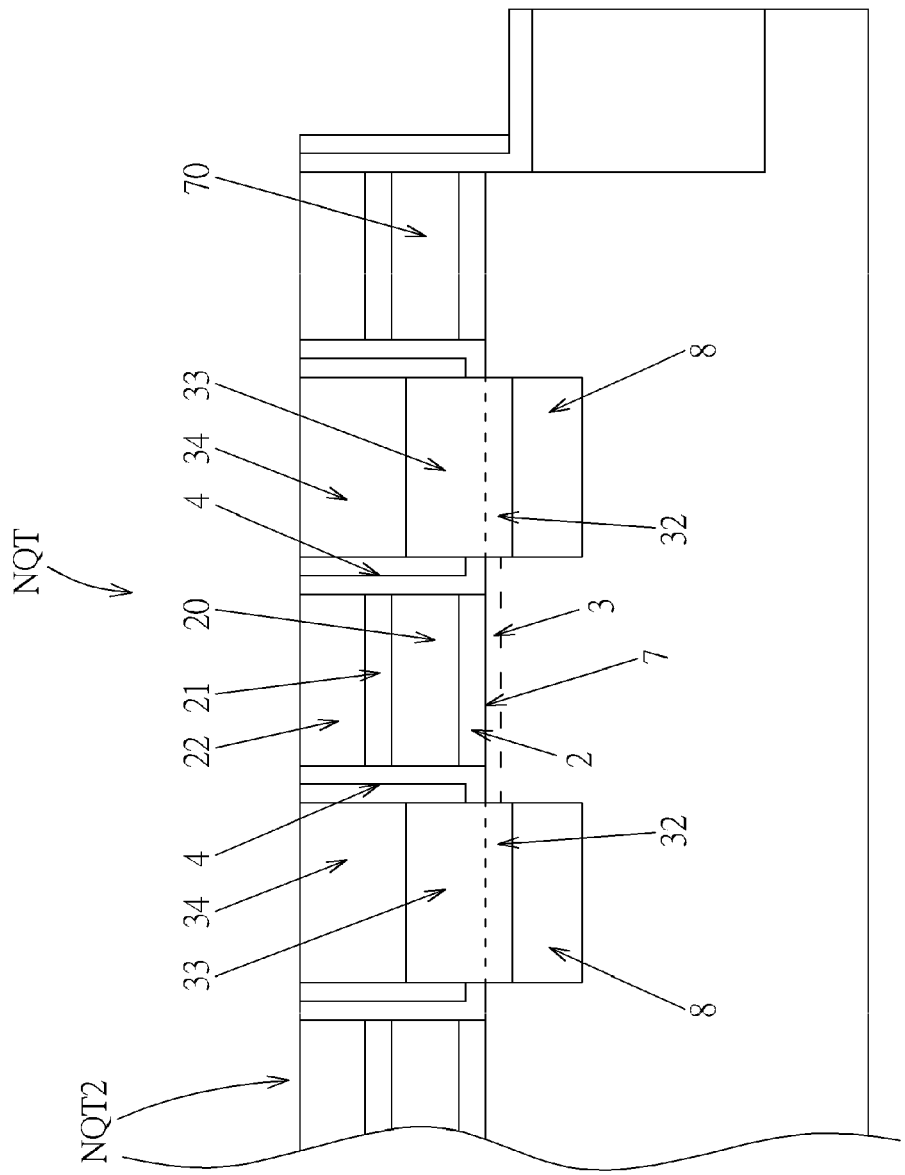
FIG. 8A illustrates a cross-section view following a step to grow the silicon pillars higher for forming NQT structures and dummy gate structures based on the structure in FIG. 4A.
Figure 8B:
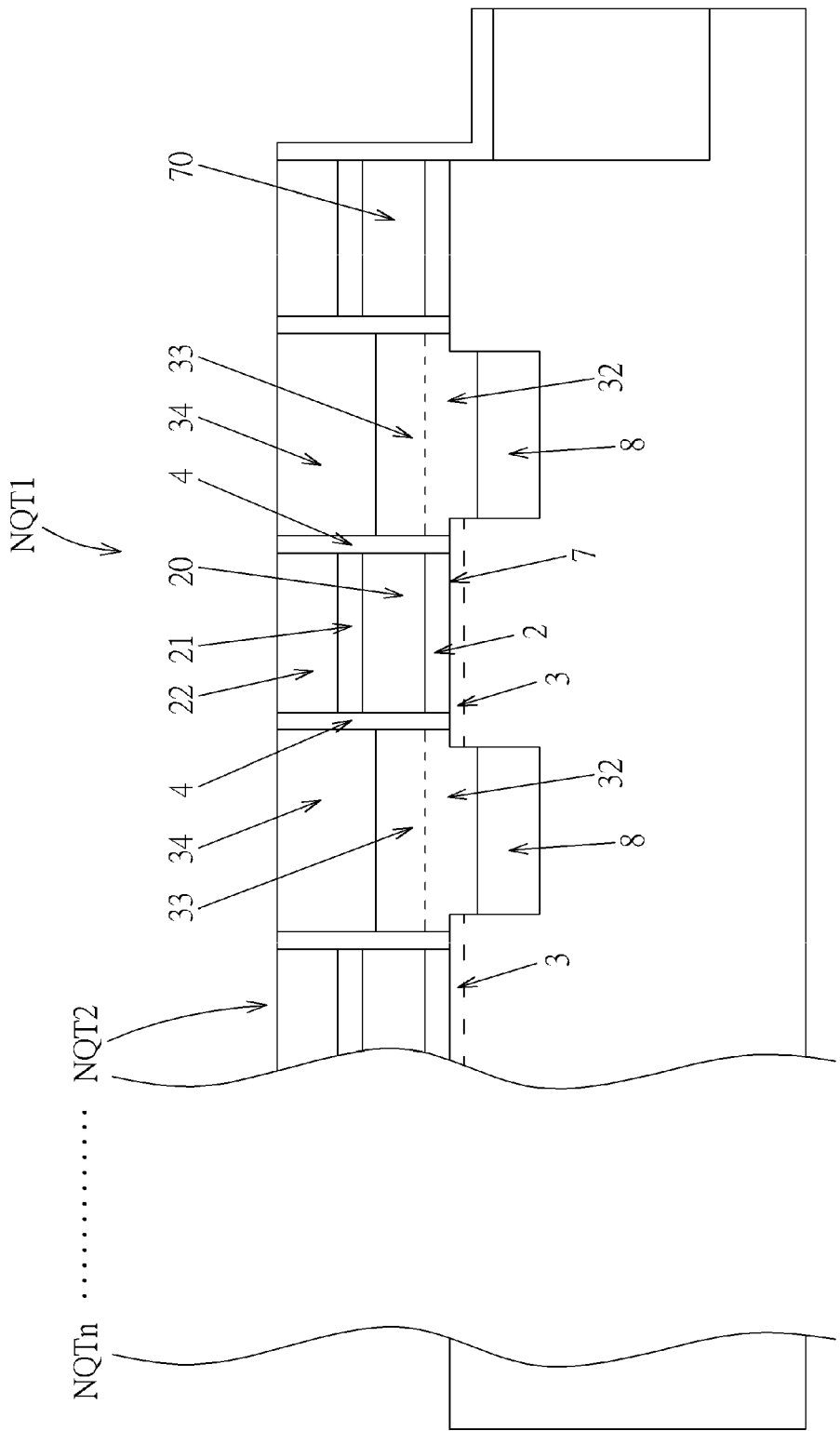
FIG. 8B illustrates a cross-section view following a step to grow the silicon pillars higher for forming NQT structures and dummy gate structures based on the structure in FIG. 4B.

(8) The single-crystalline silicon pillars can be further grown higher, but the doping concentration profile can be tuned and increased to heavily n+ doped concentration to form a further grown higher doped region 34, thus having low resistances for source/drain contact regions whose areas and resistances can be further adjusted by the height and doping concentration (or by different conducting materials, e.g. metal, silicide or the like by ALD, etc.). These source and drain regions (including the dock 32, the silicon pillar 33 and the further grown higher doped region 34) can be tiered to a certain height so as to reduce resistance as long as they are not higher than the height of the stacked structure of polysilicon 20, the cap (including nitride-2 layer 22 and oxide-2 layer 21) and other nitride/oxide layers on the top of the cap (if any), so that the source region and the drain region are blocked without connection, as shown in FIG. 8A and 8B. As shown in FIG. 8A, there is one NQT structure in the middle, and the right hand side of the NQT structure could be a dummy gate structure 70, and the left hand side of the NQT structure could be other NQT structures.

The doping concentration profile of the drain/source region is controllable, for example, the doping concentration profile from the bottom to the top of the drain/source region could include: (1) a lightly doped zone, a normal doped zone, a greater doped zone and a heavily doped zone; (2) a normal doped zone, a lightly doped zone, a greater doped zone, and a heavily doped zone; or (3) an un-doped zone, a normal doped zone, a greater doped zone and a heavily doped zone. Wherein, the concentration of the heavily doped zone is greater than that of the greater doped zone, the concentration of the greater doped zone is greater than that of the normal doped zone, the concentration of the normal doped zone is greater than that of the lightly doped zone, and the concentration of the lightly doped zone is greater than that of the un-doped zone.

(9) Moreover, if necessary, the gate-first made by polysilicon 20 can also be replaced by some gate-last metal material as necessary with an appropriate work function (from 4.0 eV to 5.2 EV) or p+ doped polysilicon.

Figure 9:
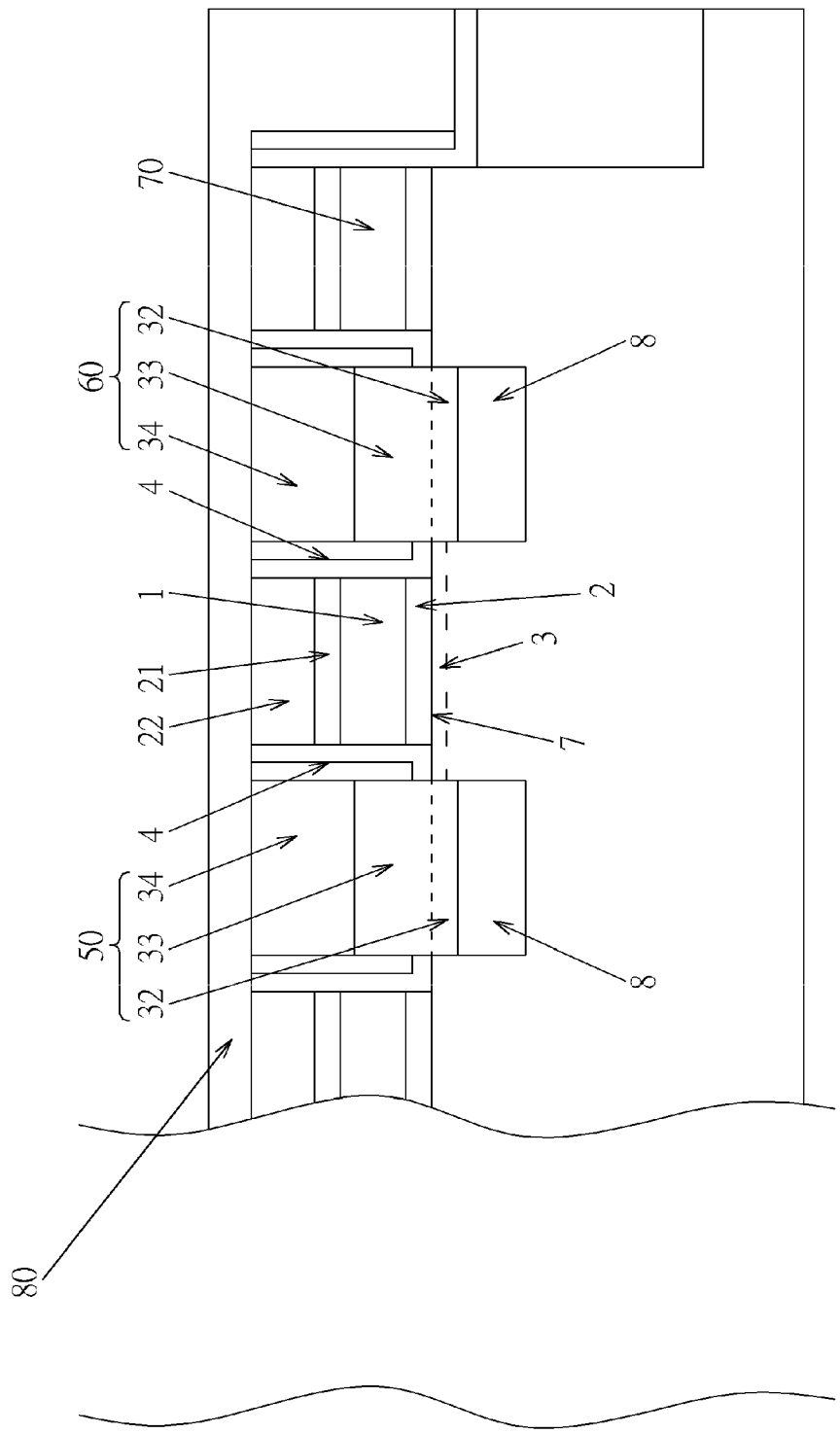
FIG. 9 illustrates a cross-section view of Vertical Tiering Drain (VTD) and Vertical Tiering Source (VTS) based on the structure in FIG. 8A.
Figure 10:
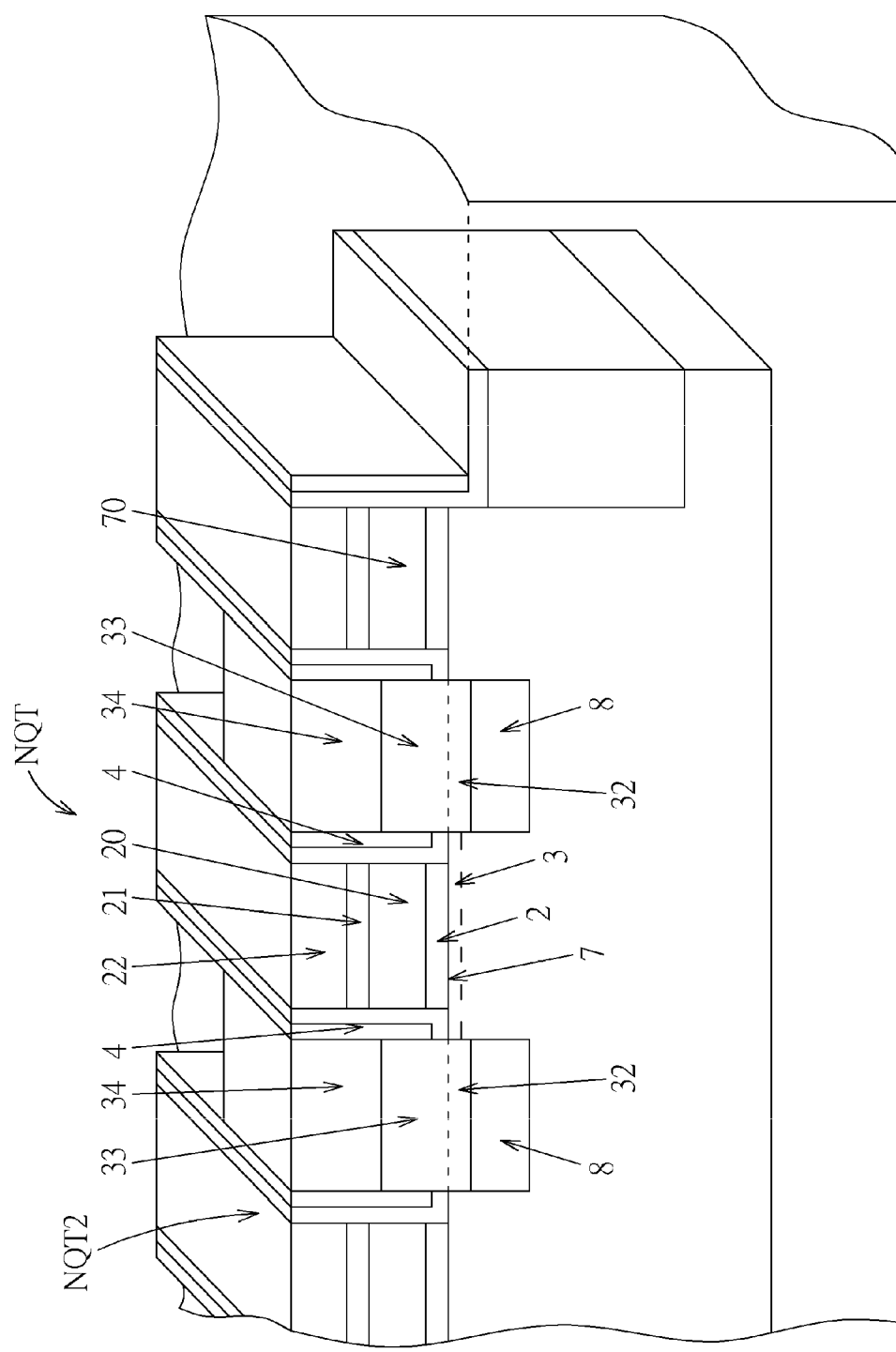
FIG. 10 illustrates a three-dimensional diagram of a NQT structure with fin-structured gate and VTD/VTS according to an embodiment of the present invention.

The final drain region is a kind of Vertical Tiering Drain (VTD) 60, and the final source region is a Vertical Tiering Source (VTS) 50, as shown in FIG. 9 in which one more isolation layer 80 is positioned on the top of the cap (including nitride-2 layer 22 and oxide-2 layer 21) and the VTD/VTS. FIG. 10 illustrates a three-dimensional diagram of a fin-structured NQT and VTD/VTS thereof according to an embodiment of the present invention based on FIG. 9 (without showing one more isolation layer 80 on the top of the cap). The Vertical Tiering Drain/Source structure truly opens a new design flexibility and controllability in contrast to the conventional design of LDD (Lightly Doped Drain) junctions inside the silicon substrate. In addition, the exposed area of the Vertical Tiering Drain/Source to the channel region 3 of the transistor is significantly reduced to only the region of channel sidewall, and the rest of the Vertical Tiering Drain/Source is fully isolated by the insulator (such as nitride, oxide or composite insulator materials, etc.), thus there are fewer leakage currents in the new NQT transistor structure of this invention, as compared with varieties of non-ideal junction and gate structures in the conventional transistor designs. This NQT transistor structure and process enhancement also makes the source and drain designs more controllable and reduces many non-ideal parasitic factors such as non-linearity, junction disturbances, various noises due to the non-ideal structure behaviors caused by the pn-junctions inside the silicon substrate in conventional silicon transistors.

In the above, all mutual self-alignments among the gate-channel region which is under the gate-dielectric 2 and the spacers 4, the source and drain regions under and above the silicon surface 7, and the heavily doped source and drain areas as contact regions are well described. Resultingly, this vertical self-alignment triode structure has made the new NQT much more accurately controllable and much more compact with smaller form-factor and less planar area being occupied to allow a much higher packing density. With well-designed result, the I-off current of the above structure could be less than 1 fA (femto-Ampere).

As described, the source/drain junction formation between drain region 6/source region 5 and the channel region 3 totally avoids using ion-implantation to form source/drain regions like conventional LDD or n+ regions which are formed by ion-implantations, thus damages formed inside the junction regions caused by ion-implantation can be reduced. Under the spacers 4 surrounding the gate 1 there is no LDD region with n-type dopants made by "intentional" manufacture process but only with majority p-type channel dopants mentioned in the aforesaid step (2) inside the p-type substrate. Thus, the p-n junction of p-channel region with n-type source/drain region is not directly under the gate-length edges. Furthermore, the depths of the source/drain regions 5 and 6 are defined by etching technique and re-growth by SEG/ALD and are constrained in the defined regions with oxide layers blocking the vertical diffusion of dopants dislike the tailing diffusion by conventional vertically implanted junction formations. Since those drain region 6/source region 5 are regrown by either deposition or epitaxy, those drain region 6/source region 5 are independent and not derived from the original silicon substrate material. Moreover, there is no ion-implanted zone between the regrown drain region 6/source region 5 and the channel region 3. In another embodiment, the channel region 3 will directly connects to the drain region 6/source region 5.

Since the width of the concave 30 is controllable by accurate photolithography/etching method and the thickness of the insulator region 8 positioned on the bottom of the concave 30 is controllable by accurate etching method as well, the thickness and the width of the root portion 5a of the source region (or the root portion 6a of the drain region) are also accurately adjustable since it is confined by the concave 30 and the insulator region 8. Thus, the channel region 3 will directly connects to the drain region 6/source region 5. Furthermore, neither ion implantation and thermal annealing, nor dopant diffusion method, is utilized to form the NQT structure, therefore the location of the pn junction and the thickness of lower portion of drain/source region of the NQT structure are well controllable, as compared with the larger variation of the depth/location of the pn junction formation by conventional either implantation/thermal annealing or dopant diffusion method. The pn junction of the NQT structure is aligned with or substantially close to the junction between the channel region 3 and the drain region 6/source region 5.

This invented NQT structure includes a gate structure and a cap structure above the gate structure which extends upward from the gate dielectric on the silicon surface. Spacers surrounds the sidewalls of the gate and the cap structure. A drain region (or the first conductive region") extends downward from the silicon surface to one insulator region which is positioned in a concave and also extends upward from the silicon surface. Similarly, a source region (or the second conductive region) also extends downward from the silicon surface to another insulator region which is positioned in another concave and also extends upward from the silicon surface. The top surfaces of the drain/source regions are not higher than the top surface of the cap structure such that the source region and the drain region are blocked without connection. Each source/drain region is confined by the insulator region and the spacers on the sidewalls of the gates, and the exposed area of the source/drain regions to the channel region of the NQT transistor is significantly reduced. The channel region is not only under the gate structure, but also under the spacer. The upward extending direction of the gate structure, source region and the drain region are perpendicular or substantially perpendicular to the silicon surface.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transistor structure comprising:
   a gate structure based on a semiconductor substrate, wherein the semiconductor substrate comprises a semiconductor surface and is made of a first semiconductor material;
   a channel region under the semiconductor surface, the channel region including a first terminal and a second terminal;
   a drain region independent from the semiconductor substrate, the drain region including a first predetermined physical boundary directly connected to the first terminal of the channel region;
a source region independent from the semiconductor substrate, the source region including a second predetermined physical boundary directly connected to the second terminal of the channel region;
a first isolator; and
a first etched concave having a first side barrier to reveal a first seed portion of the first semiconductor material and having a second side barrier opposite to the first side barrier, wherein the first isolator is positioned above a bottom of the first etched concave and the drain region is above the first isolator;
wherein between the gate structure and another gate structure next to the transistor structure, the drain region is continuously extended from the first side barrier to the second side barrier without blocked by the first isolator, there is no isolation layer exists in the drain region, and the first side barrier is adjacent to a spacer of the transistor structure and the second side barrier is adjacent to a spacer of the neighbor transistor structure;
wherein the first isolator is limited within the first etched concave and no other isolator is extended underneath the gate structure.

2. The transistor structure in claim 1, wherein the spacer covers sidewalls of the gate structure, wherein the first predetermined physical boundary of the drain region is aligned with a first edge of the spacer and the second predetermined physical boundary of the source region is aligned with a second edge of the spacer.

3. The transistor structure in claim 2, wherein the drain region includes a lower portion in the first etched concave and an upper portion stacked on the lower portion and contacting with the spacer, and the first side barrier is aligned with the first predetermined physical boundary of the drain region.

4. The transistor structure in claim 3, wherein the lower portion of the drain region is directly connected to the first terminal of the channel region, and a top surface of the upper portion of the drain region is made of semiconductor and is not lower than a top surface of the gate structure.

5. The transistor structure in claim 3, wherein the silicon surface of the first semiconductor material is a top surface of a fin structure and the first etched concave is formed in the fin structure, and a thickness of the lower portion of the drain region or a thickness of the channel region is independent from a thickness of the fin structure.

6. A transistor structure comprising:
a fin structure with a top surface;
a gate structure coupled to the fin structure and the top of the gate structure is higher than the top surface of the fin structure;
a first etched concave, and a bottom of the first concave being lower than the top surface of the fin structure, wherein the first etched concave has a first side barrier to reveal a first seed portion and has a second side barrier opposite to the first side barrier;
a first isolator formed in the first concave and above the bottom of the first concave, and all top surface of the first isolator being lower than the top surface of the fin structure, wherein the first isolator is limited within the first concave;
a first conductive region on the first isolator, wherein at least a portion of the first conductive region is a first single-crystalline region, the first single-crystalline region is laterally grown from the first seed portion and accommodated by the first etched concave, a top surface of the first conductive region is higher than the top surface of the fin structure, and the first conductive region is a semiconductor drain region;
a second etched concave and a bottom of the second concave being lower than the top surface of the fin structure, wherein the second etched concave has a third side barrier to reveal a second seed portion and has a fourth side barrier opposite to the third side barrier;
a second isolator being formed in the second concave and above the bottom of the second concave, wherein all top surface of the second isolator is lower than the top surface of the fin structure, and the second isolator is limited within the second concave; and
a second conductive region on the second isolator, wherein at least a portion of the second conductive region is a second single-crystalline region, and the second single-crystalline region is laterally grown from the second seed portion and accommodated by the second etched concave, and the second conductive region is a semiconductor source region;
wherein no other isolator is extended underneath the gate structure.

7. The transistor structure in claim 6, further comprising:
a spacer covering a first sidewall of the gate structure and a second sidewall of the gate structure;
wherein the first conductive region abuts against portion of the spacer covering the first sidewall of the gate structure, and the first conductive region has a first predetermined doping concentration profile along an upward extension direction of the first conductive region, and the second conductive region abuts against the portion of the spacer covering the second sidewall of the gate structure, and the second conductive region has a second predetermined doping concentration profile along an upward extension direction of the second conductive region.

8. The transistor structure in claim 7, further comprising a channel region under the top silicon surface, wherein the channel region includes a first terminal and a second terminal, and the first etched concave is adjacent to the first terminal of the channel region and the second etched concave is adjacent to the second terminal of the channel region.

9. The transistor structure in claim 8, wherein the first single-crystalline region laterally grown from the first seed portion is below the top surface of the fin structure and contacts with the first terminal of the channel region, and the second single-crystalline region laterally grown from the second seed portion is below the top surface of the fin structure and contacts with the second terminal of the channel region.

10. The transistor structure in claim 7, further comprising a cap structure positioned above the gate structure, wherein a first top surface of the first conductive region is not higher than the top of the cap structure, and a second top surface of the second conductive region is not higher than the top of the cap structure.

11. The transistor structure in claim 6, wherein a thickness of the first etched concave is in a range of 20 nm to 50 nm.

12. The transistor structure in claim 6, wherein the first single-crystalline region laterally grown from the first seed portion is below the top surface of the fin structure, and a thickness of the first single-crystalline region laterally grown from the first seed portion is between 5 nm and 20 nm.

13. The transistor structure in claim 6, and the top surface of the first conductive region is higher than a top surface of the gate structure.

14. A transistor structure comprising:
- a gate structure based on a semiconductor substrate, wherein the semiconductor substrate includes a semiconductor surface and is made of a first semiconductor material;
- a channel region under the semiconductor surface, the channel region including a first terminal and a second terminal;
- a drain region independent from the semiconductor substrate, the drain region including a first predetermined physical boundary directly connected to the first terminal of the channel region;
- a source region independent from the semiconductor substrate, the source region including a second predetermined physical boundary directly connected to the second terminal of the channel region;
- a first etched concave having a first side barrier to reveal a first side seed portion of the first semiconductor material, wherein a first isolator is positioned above a bottom of the first etched concave and the drain region is above the first isolator, a lower portion of the drain region is selectively grown from the first side seed portion and without grown from any bottom seed portion, and there is no isolation layer exists in the drain region; and
- a second etched concave having a second side barrier to reveal a second side seed portion of the first semiconductor material, wherein a second isolator is positioned above a bottom of the second etched concave and the source region is above the second isolator, and a lower portion of the source region is selectively grown from the second side seed portion without grown from any bottom seed portion.

* * * * *